(12) United States Patent
Altemus et al.

(10) Patent No.: US 8,962,067 B2
(45) Date of Patent: Feb. 24, 2015

(54) REAL TIME PROCESS CONTROL OF THE POLYMER DISPERSION INDEX

(71) Applicant: Tokyo Electron Limited, Tokyo (JP)

(72) Inventors: Bruce Adair Altemus, Scotia, NY (US); Scott W. LeFevre, Ballston Spa, NY (US)

(73) Assignee: Tokyo Electron Limited, Tokyo (JP)

( * ) Notice: Subject to any disclaimer, the term of this patent is extended or adjusted under 35 U.S.C. 154(b) by 86 days.

(21) Appl. No.: 13/749,307

(22) Filed: Jan. 24, 2013

(65) Prior Publication Data

US 2014/0205742 A1 Jul. 24, 2014

(51) Int. Cl.
*C23C 16/52* (2006.01)

(52) U.S. Cl.
CPC ....................... *C23C 16/52* (2013.01)
USPC ..................... 427/8; 427/9; 427/10

(58) Field of Classification Search
USPC .................................. 427/8, 9, 10
See application file for complete search history.

(56) References Cited

U.S. PATENT DOCUMENTS

| | | | | |
|---|---|---|---|---|
| 4,125,573 A * | 11/1978 | Kruse | ............... | 525/87 |
| 5,112,642 A * | 5/1992 | Wajid | ............... | 427/10 |
| 6,642,346 B2 * | 11/2003 | Brandenburg et al. | ....... | 528/310 |
| 2004/0082730 A1 * | 4/2004 | Japp et al. | ...................... | 525/391 |
| 2007/0104860 A1 * | 5/2007 | Gleason et al. | .............. | 427/2.14 |
| 2008/0241382 A1 * | 10/2008 | Clark | ........................ | 427/255.28 |
| 2009/0304906 A1 * | 12/2009 | Suduo et al. | ....................... | 427/8 |
| 2012/0201954 A1 * | 8/2012 | Wajid | ................ | 427/9 |

OTHER PUBLICATIONS

Marx, Kenneth A., "Quartz Crystal Microbalance: A Useful Tool for Studying Thin Polymer Films and Complex Biomolecular Systems at the Solution-Surface Interface". Biomacromolecules, vol. 4, No. 5, 2003, pp. 1099-1120.*
Hamilton, W.A., et al., "Determining the Density Profile of Confined Polymer Brushes with Neutron Reflectivity". Journal of Polymer Science: Part B: Polymer Physics, vol. 42, 3290-3301 (2004).*

* cited by examiner

*Primary Examiner* — Bret Chen

(57) ABSTRACT

Processes for real time process control of the Polymer Dispersion Index (PDI) during polymerization processes. By tuning this chain length distribution in real time, a resulting polymer can have predetermined physical properties such as thickness, physical yield strength, decomposition time, thermal stability, etc. Techniques herein can dynamically control chain length distribution through use of a mass density measurement device located within a processing chamber and providing real time feedback of polymer growth. Chamber parameters can be controlled or modified before and during polymerization based on mass density feedback. Such chamber parameters can include pressure, temperature, chemistry, and process gas flow rates and flow periods.

18 Claims, 4 Drawing Sheets

REAL TIME PROCESS CONTROL OF THE POLYMER DISPERSION INDEX

FIELD OF INVENTION

This disclosure relates to systems and methods for forming polymers and films, including polymer films covering substrates.

BACKGROUND OF THE INVENTION

Polymerization is the process of reacting monomers (molecules that can chemically bind to other molecules) together to form polymers—chains of repeating structural units. Polymerization is often executed to form thin films on various objects such as semiconductor wafers, flat panels, and other substrates. One conventional polymerization process involves using a process chamber to control chemistry and temperature to create a polymer surface covering on a given substrate.

In one conventional process, monomers of a given chemistry are applied to (or deposited on) a substrate. The monomers can be considered as a group of short molecular chains. After monomer application, a linker is introduced. This linker is also known as an initiator. The initiator functions to bring together or link the short molecular chains, thereby serving in a binding capacity. Thus, the initiator helps to form or create large or long molecular chains from the short molecular chains.

Polymers can be created having various different chain lengths and architectures. Additionally, physical and chemical properties of a given polymer can be a function of chain length. The polymer dispersion Index (PDI) is a metric that details the distribution of polymer chain lengths within a sample polymer. Accordingly, for certain applications, a relatively short chain length may be desired, while other applications call for polymer properties associated with polymers having relatively long chain lengths.

SUMMARY OF THE INVENTION

Creating polymers of a particular chain length, that is, creating polymers having a specific polymer dispersion Index (PDI), is difficult. One issue is that in conventional polymerization processes there is no in situ (inside the chamber) characterization of the polymerization process to identify chain length growth at any given point during polymerization. Instead, conventional polymerization measurement involves removing a wafer from the chamber after polymer growth is completed, and then separately running many analytical tests to identify resulting polymerization characteristics and chain length dispersion. Thus, achieving a polymer with specific properties can involve guesswork and estimation, as well as post-processing testing. It would be advantageous, however, to know real time progress of chain length growth during polymerization to assist with creating polymers having a specific PDI.

Techniques herein include systems and methods for real time process control of the PDI during polymerization processes. With techniques herein, a mass density measurement device is added to the processing chamber. This mass density measurement device provides real time feedback of polymer growth. With such polymer growth feedback, chamber parameters can be controlled or modified before and during polymerization to produce a resultant polymer having specified characteristics. Such chamber parameters can include pressure, temperature, chemistry, and process gas flow rates and flow periods.

The mass density measurement device can include any sensor that can be used to measure—directly or indirectly—changes in mass density on the surface of a substrate. One example of such a sensor is a quartz crystal microbalance (QCM). A QCM can be added to the processing chamber as a technique for real time in situ monitoring. With the QCM in the chamber adjacent to a substrate, polymerization will happen on the QCM as well as on the wafer. A QCM sensor functions by measuring changes in frequency of a quartz crystal resonator. As material is adsorbed on the QCM, this adsorbed mass causes a change in a resonant frequency of the QCM. The frequency coming from the QCM is a function of the mass or mass density being adsorbed onto the QCM. Changes in such frequency can be used to control or maximize polymerization in real time.

One embodiment includes a method of forming a polymer film or other thin films. This method comprises several steps. A substrate is disposed on or placed on a substrate in a process chamber of a vapor deposition system. A mass density measurement device is positioned in the process chamber adjacent to the substrate holder. A gas-phase monomer of a first monomer type is flowed into the process chamber such that a layer of monomer is deposited on a surface of the substrate and also deposited on the mass density measurement device. A gas-phase initiator is flowed into the process chamber such that the initiator causes monomers to polymerize in the layer of monomer. Mass density changes of the monomer/polymer layer are monitored via the mass density measurement device. Process conditions are controlled within the process chamber based on mass density changes measured from the mass density measurement device such that a resultant polymer layer on the surface of the substrate has a predetermined parameter.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION OF SEVERAL EMBODIMENTS

Figure 1:
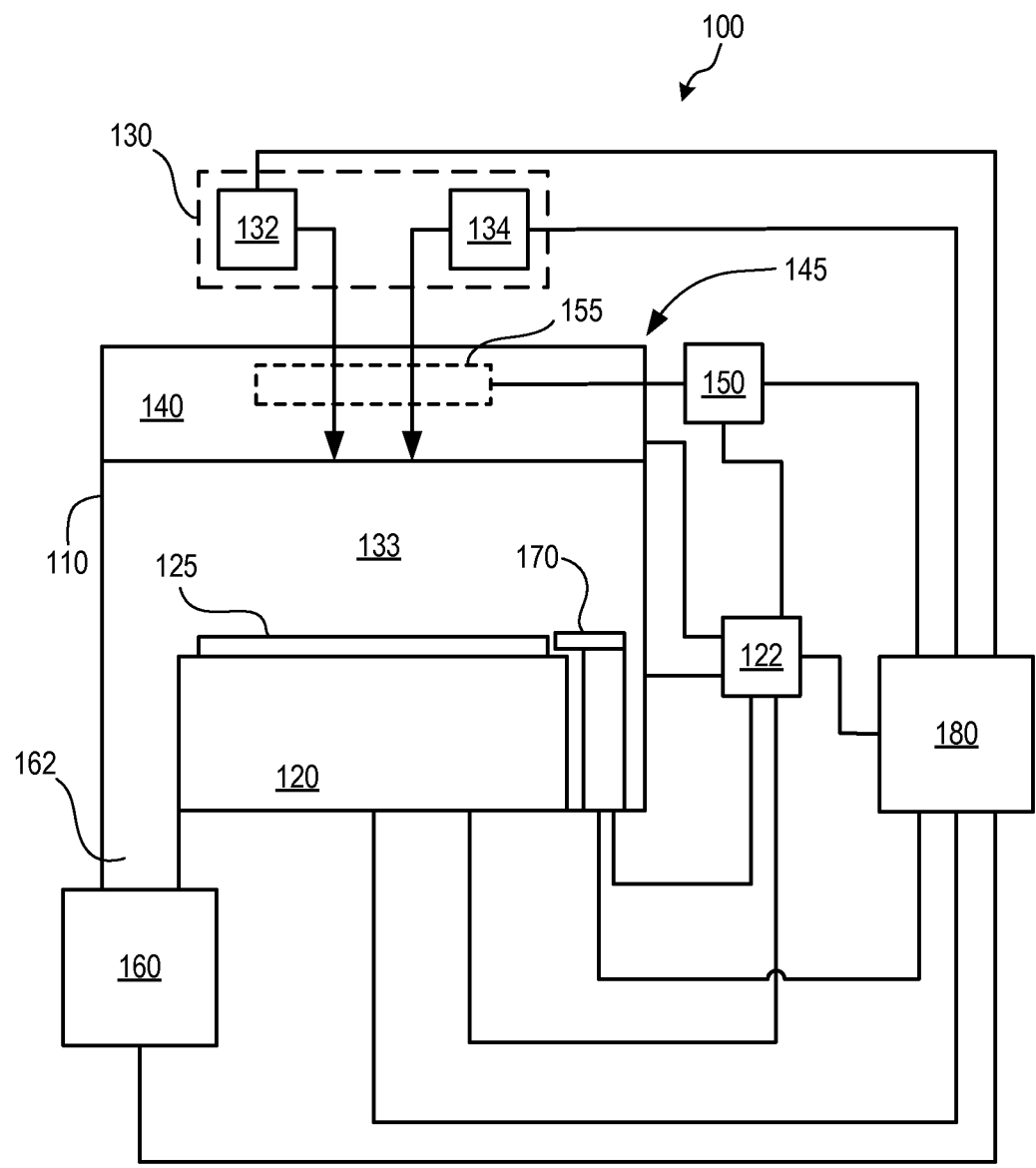
FIG. 1 is a schematic diagram of a vapor deposition system according to embodiments disclosed herein.

In the following description specific details are set forth. It should be understood, however, that the invention may be practiced in other embodiments that depart from these specific details, and that such details are for purposes of explanation and not limitation. Embodiments disclosed herein will be described with reference to the accompanying drawings. Similarly, for purposes of explanation, specific numbers, materials, and configurations are set forth in order to provide a thorough understanding. Nevertheless, embodiments may be practiced without such specific details. Components having substantially the same functional constructions are denoted by like reference characters, and thus any redundant descriptions may be omitted.

Various techniques may be described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to the object being processed in accordance with the invention. The substrate may include any material portion or structure of a device, particularly a semiconductor or other electronics device, and may, for example, be a base substrate structure, such as a semiconductor wafer, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only.

Techniques disclosed herein include systems and methods for real time process control of the Polymer Dispersion Index during polymerization processes. The Polymer Dispersion Index (PDI) is a metric that details the distribution of a polymer chain length within a sample. Polymers can have relatively short lengths of molecular chains, relatively long lengths of molecular chains, a mixture of chain lengths, as well as different chain geometries. Physical properties of a given polymer are often a function of polymer chain length distribution. By tuning this chain length distribution in real time with techniques herein, that is, tuning chain length during a polymer creation process, a resulting polymer can have physical properties selected for a particular application such as packaging and sensor applications among others.

Techniques herein can dynamically control chain length distribution through use of a mass density measurement device located within a processing chamber. This mass density measurement device provides real time feedback of polymer growth. With such polymer growth feedback, chamber parameters can be controlled or modified before and during polymerization—based on mass density feedback—to produce a resultant polymer having specified characteristics. Such chamber parameters can include pressure, temperature, chemistry, and process gas flow rates and flow periods.

Referring now to the drawings, techniques herein relate to a deposition system and method for treating a substrate. Such treatment includes depositing a thin film using a deposition process, such as vapor deposition. Techniques further relate to a deposition system and method for depositing a thin polymer film using filament-assisted chemical vapor deposition (CVD) or pyrolytic CVD, in which a gas heating device, such as a heating element array, is used to crack or pyrolize an initiator or film forming composition.

FIG. 1 schematically illustrates a CVD system 100. There are various types of deposition systems that can be used with embodiments herein, for convenience in describing embodiments, this disclosure will focus on a filament-assisted CVD (FACVD) system. CVD system 100 comprises a process chamber 110 having a substrate holder 120 configured to hold a substrate 125, upon which a thin film or polymer film can be formed. The substrate holder can also be configured to control temperature of the substrate such as keeping the substrate 125 as a temperature suitable for film forming reactions.

The process chamber 110 is coupled to a film forming composition delivery system 130 configured to introduce a film forming composition into the process chamber 110 through a gas distribution system 140. A gas heating device 145 is coupled to, or located downstream from, the gas distribution system 140. The gas heating device 145 is configured to chemically modify film forming compositions.

The gas heating device 145 can use various means for applying heat such as a heating element array 155 having a plurality of heating elements or zones configured to receive a flow of a film forming composition from the film forming composition delivery system 130 and the gas distribution system 140 across or through the plurality of heating elements (for example, a filament grid or array). One or more power sources 150 can be coupled to the heating element array 155. Such heat application causes thermochemical separation of one or more constituents of a film forming application. This thermochemical separation is also referred to as cracking.

The process chamber 110 is further coupled to a vacuum pumping system 160 through a duct 162, wherein the vacuum pumping system 160 is configured to evacuate the process chamber 110 and the gas distribution system 140 to a pressure suitable for forming the thin film on the substrate 125 and suitable for cracking a film forming composition or constituent.

The film forming composition delivery system 130 can include one or more material sources configured to introduce a film forming composition to the gas distribution system 140. For example, the film forming composition may include one or more gases, or one or more vapors formed in one or more gases, or a mixture of two or more thereof. The film forming composition delivery system 130 can include one or more gas sources, or one or more vaporization sources, or a combination thereof. Herein vaporization refers to the transformation of a material (normally stored in a state other than a gaseous state) from a non-gaseous state to a gaseous state. Therefore, the terms "vaporization," "sublimation" and "evaporation" are used interchangeably herein to refer to the general formation of a vapor (gas) from a solid or liquid precursor, regardless of whether the transformation is, for example, from solid to liquid to gas, solid to gas, or liquid to gas.

When the film forming composition is introduced to the gas heating device 145, one or more constituents of the film forming composition are subjected to pyrolysis or cracking by the gas heating device 145 described above. The film forming composition can include film precursors that may or may not be fragmented by heating in the gas heating device 145. The film precursor or precursors may include the principal atomic or molecular species of the film desired to be produced on the substrate. Additionally, the film forming composition can include a reducing agent that may or may not be fragmented by the gas heating device 145. The reducing agent (or agents) may assist with the reduction of a film precursor on substrate 125. For instance, the reducing agent may react with a part of, or substantially all of, the film precursor on substrate 125. Additionally yet, the film forming composition can include a polymerizing agent (known as a cross-linker or initiator) that may or may not be fragmented by the gas heating device 145. The initiator (polymerizing agent) may assist with the polymerization of a film precursor or fragmented film precursor (monomers) on substrate 125.

Note that there are various chemistries, precursors, initiators, monomers, etc., that can be used in various polymerization reactions. For example, multiple different monomers can be used in conjunction with multiple different initiators. For convenience in explaining techniques herein, this description will primarily focus on a basic polymerization reaction. Specifically, a monomer is created or accessed and deposited on a substrate or flowed towards a substrate. Then an initiator is used to cause the monomers to create linkages with each other, thereby forming a polymer.

Accordingly, a first material source 132 supplies a monomer into process space 133 passing through the gas distribution system 140 which can heat the monomer to a specified temperature. The monomer can then flow towards substrate 125 and be deposited thereon, such as by the substrate being at a temperature conducive to adsorption. A mass density measurement device 170 is positioned adjacent to the substrate holder 120. Mass density measurement device 170 can also be maintained at the temperature conducive to adsorption. With mass density measurement device 170 positioned adjacent to substrate 125, monomer is also adsorbed on the mass density measurement device 170. A second material source 134 supplies an initiator into process space 133 passing through the gas distribution system 140, which can thermally crack the initiator resulting in an agent that causes monomers to link with each other, thereby executing a polymerization reaction and forming a polymer film on the substrate 125 and mass density measurement device 170.

A temperature control system 122 can be coupled to the gas distribution system 140, the gas heating device 145, the process chamber 110, the substrate holder 120, and/or the mass density measurement device 170. The temperature control system 122 is configured to control the temperature of one or more of these components. The temperature control system can includes a temperature measurement system configured to measure temperature of the components at various locations. Temperature measurements can be used to adjust or control temperature of the various components.

A controller 180 can be used to control the film forming composition deliver system 130, the gas heating device 145, power source 150, temperature control system 122, and vacuum pumping system 160. Thus, for a given reaction, the controller 180 can control temperature, pressure, gas flows, gas fragmentation and timing of the CVD system 100. The controller 180 also receives feedback or data from mass density measurement device 170. The controller 180 can respond to program instructions or manual input to create and modify process conditions including adjusting process conditions during a polymerization reaction and in response to feedback from the mass density measurement device 170.

Note that CVD system 100 can include additional components and subcomponents as are conventionally implemented. For example, the vacuum pumping system 160 can include two or more pumps such as a turbo-molecular vacuum pump and a roughing pump, the substrate holder can include a clamping system (either electrical or mechanical) that clamps the substrate 125 to the upper surface of the substrate holder, the process chamber 110 can include a cleaning system, and so forth.

The mass density measurement device can include any sensor that can be used to measure changes in mass density on the surface of a substrate. Such measurement of mass density can be a direct measurement or an indirect measurement. One example of such a sensor is a quartz crystal microbalance (QCM). A QCM can be added to the processing chamber as a technique for real time in situ monitoring. With the QCM in the chamber adjacent to a substrate, polymerization will happen on the QCM as well as the wafer. A QCM sensor functions by measuring changes in frequency of a quartz crystal resonator. As material is adsorbed on the QCM, this adsorbed mass causes a change in a resonant frequency of the QCM. The frequency coming from the QCM is a function of the mass or mass density being adsorbed onto the QCM. Identified changes in such frequency can then be used to control or maximize polymerization in real time.

The QCM sensor can be positioned at various locations and orientations within the process chamber 110, still being adjacent to the substrate. Detailing polymer growth is typically more accurate by locating the QCM sensor as close to the chuck (substrate holder) and substrate as possible. With processing conditions established, the frequency change details the absorbed mass as outlined by the Sauerbrey equation. This absorbed layer is chemical and temperature dependent which can be identified through use of the Clausius-Claperon equation. The Sauerbrey equation and Clausius-Claperon equation are conventionally used with QCM devices.

The mass density measurement device can be embodied as other types of sensors. These platforms incorporate other transduction methods such as optical, amperometric, voltammetric and acoustical (in-plane). Optical sensing platforms can be incorporated onto deposition and/or etch chambers to determine such factors as etch rate. With this embodiment, light reflected off of the backside of the deposited surface is collected. The amplitude of the reflected signal increases as the film is deposited onto the sensor. The mass density of the film is then determined by comparing the signal amplitude verses time. In another example embodiment, sensors using voltage or amperage shift as the deposition occurs provide an alternative sensing mechanism to determine the mass density as well. The rate of change of the signal is dependent on the mass density of the material being deposited.

Figure 5:
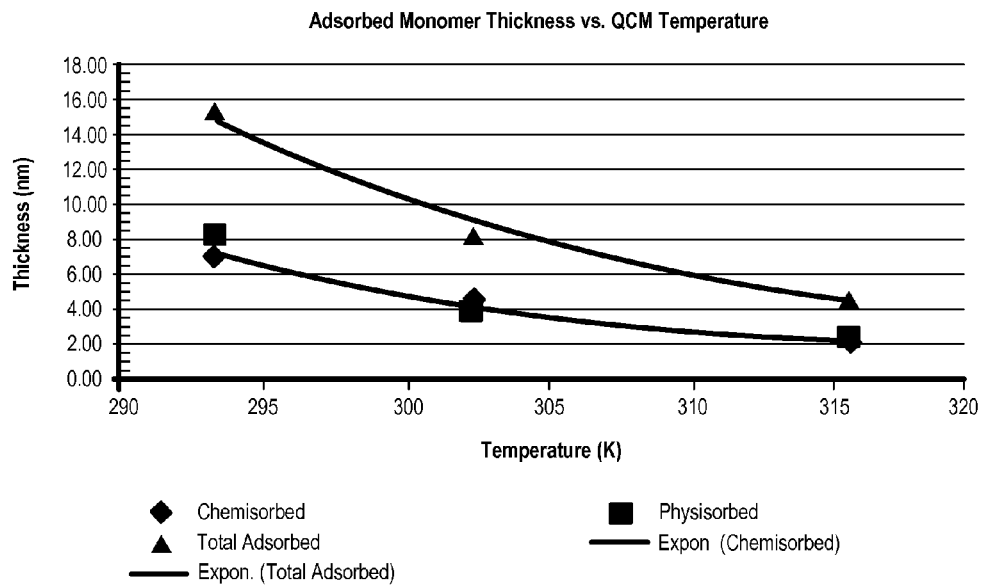
FIG. 5 is a chart illustrating adsorbed monomer thickness in relation to QCM temperature.

FIG. 5 is a chart that illustrates the relationship between adsorbed monomer thickness and QCM temperature. This chart shows that adsorbed mass of a particular example monomer is a function of temperature. By knowing the absorbed mass as a function of temperature, a number of cubic centimeters of initiator can be determined for a given reaction.

Figure 6:
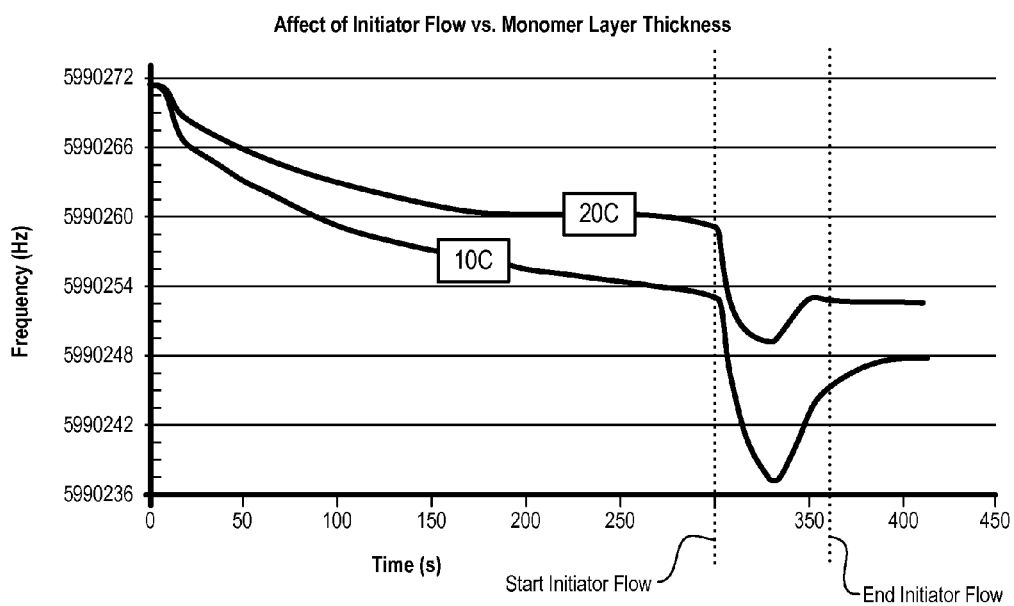
FIG. 6 is a chart illustrating mass density changes of a monomer/polymer layer in relation to initiator flow as discovered herein.

FIG. 6 is a chart illustrating discoveries herein for an example polymerization reaction. Specifically, FIG. 6 illustrates the effect of initiator flow relative to monomer layer thickness and mass density. The vertical scale of this chart shows frequency in Hz while the horizontal scale identifies time in seconds. This frequency can be identified by a QCM. Thus, FIG. 6 illustrates a line plot showing the effect of mass growth on the frequency of an oscillating QCM. In this graph, a QCM is in a process chamber alongside a wafer. A monomer is flowed into the chamber (typically as a gas) and begins to deposit on the wafer and QCM. The time period, in this example, from zero to about 300 seconds can be considered a static mode of adsorbing mass. During this initial period or static mode, a gas is flowed into the chamber and an amount of molecules (monomers) begins to be adsorbed on the surfaces of the substrate and QCM. A thickness of monomers adsorbed is typically a function of temperature, as shown in FIG. 5. The colder a surface is, the more monomer is adsorbed to that surface, while the hotter a surface is the less monomer is adsorbed. This step is also known as flowing a film precursor.

In this example, at about 300 seconds, an initiator begins to flow into the chamber. A particular chemistry/composition of initiator can be flowed into the chamber without treatment. Typically, however, there is filament that assists with initiator preparation or creation. Within some initiators there is an oxygen-oxygen bond. The filament (hot filament) then provides thermal energy to break this oxygen-oxygen bond. Thus, the hot filament is used to crack the initiator. The filament is not needed to assist with monomer preparation, though particular types of monomers can be heat processed prior to deposition. This cracked initiator is then used to bring together monomer chains. With broken oxygen-oxygen bonds, the initiator is looking for a monomer chain to attach to, and this initiator will provide a pathway for other monomers to attach to each other.

In practice, gas flow of the components can be sequential or dynamic/simultaneous. For example, a monomer can be flowed first, which is then followed by flowing the initiator. Upon flowing the initiator, the monomer flowing can be tapered, paused or turned off. Alternatively, the process can be more dynamic where the monomer and initiator are flowed simultaneously or in overlapping pulses, with the majority of polymerization happening at the surface.

As the initiator reaches the surface of the monomer layer on the substrate, the initiator begins reacting the monomers. During this reaction the QCM begins adsorbing mass at its surface as is shown by the steep drop in frequency from 300 seconds to about 330 seconds. Part of this increase in mass can be attributed to the initiator being deposited on the surface. After about 30 seconds (at time 330 seconds) note that the frequency of the QCM begins a sharp increase which means that the mass density of the polymer on the QCM is decreasing. Note that QCMs do not typically monitor weight, but instead monitor mass or density of mass. Changes in volume or density can be reflected in the mass.

During some polymerization reactions, the monomer/polymer film can begin to swell as molecular linkages are made and the molecules are restructured and repositioned. This can sometimes cause the polymer film to increase in volume. With some reactions the swelling can be approximately proportional to the amount of adsorbed monomer. For example, a relatively thicker monomer layer can result in more swelling and growing as the initiator assists in creating polymer chains—with more monomers to combine, more room can be needed.

With other polymerization reactions, there can be a significant amount of vertical cross linking. With a monomer layer on a substrate, the initiator starts reacting monomers on the top surface of the monomer layer. Monomers below can then or eventually begin to crosslink from the top down as "trapped" monomers from the bottom of the monomer layer try to create linkages.

In this example, from around 330 seconds to about 360 seconds there is a sharp increase in frequency, after which the frequency begins to level, which can indicate that all of the monomers have reacted to form polymers.

Depending on the thickness of the adsorbed monomer, filament properties and initiator flow rate can be controlled (such as in time and amount/degree) to let a corresponding film react and complete a polymerization cycle. Polymer chain length can be controlled by an amount of initiator. Up to a particular point, the more initiator that is supplied to a monomer layer, the longer the resulting polymer chains become. At a given amount or exposure amount of initiator, the polymers begin to saturate or terminate polymer ends too quickly, and this can be identified via the QCM. For example, if a particular application specifies a polymer with a relatively low PDI, then initiator flow and amount can be limited based on QCM monitoring, to result in a lower PDI. If a particular application specifies a resulting polymer with a relatively high PDI, then monomer amount, initiator flow time and amount can be controlled to produce that result. Automated systems and programs can assist so that the QCM is monitored to know when the polymerization has stopped, and then can add another layer of monomer or proceed to another process or otherwise complete processing. For example, upon identifying that a polymerization process has substantially completed, a new pulse of monomer can be initiated to continue monomer adsorption on the substrate.

Figure 3:
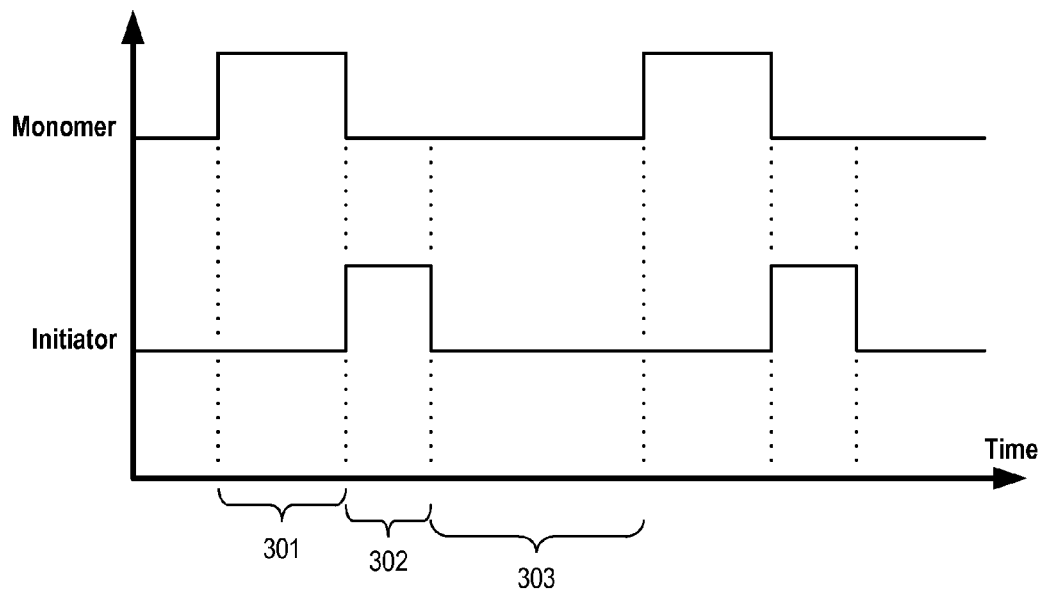
FIG. 3 is chart illustrating an example monomer and initiator flow according to techniques disclosed herein.

FIG. 3 illustrates an example flow sequence for a basic polymerization reaction. In time period 301, a monomer is flowed to a substrate, and then that flow is stopped. In time period 302, an initiator is flowed to the substrate and then initiator flow is stopped. In time period 303 there is no gas flow. Time period 303 can allow for polymer bonds to form and/or can be used for annealing the polymer film. This sequence can then be restarted and executed many times depending on a polymer thickness desired.

Figure 4:
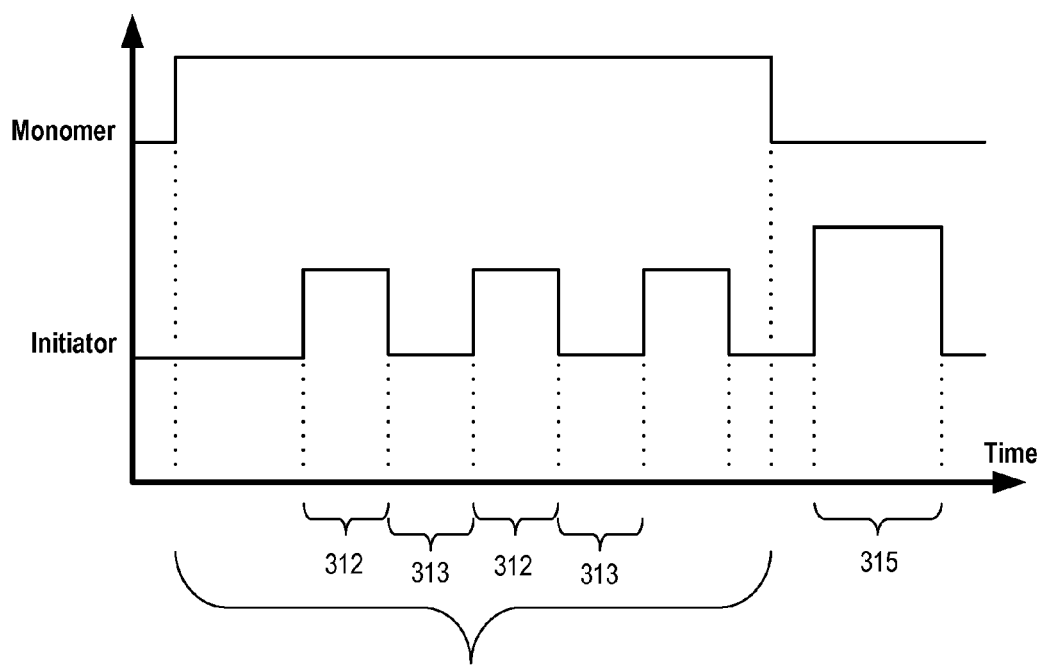
FIG. 4 is chart illustrating an example monomer and initiator flow according to techniques disclosed herein.

FIG. 4 illustrates an example alternative flow sequence for a polymerization reaction. At the start of time period 311, monomer flow is initiated and continued. With such continuous monomer flow, initiator is flowed during time periods 312, and paused during time periods 313. For example, initiator can be flowed until an equilibrium is reached as identified by a QCM, and then more initiator can be pulsed. After the continuous monomer flow is ceased, in time period 315 a relatively larger pulse of initiator can be flowed as a saturating burst. After completing a polymerization sequence, there can still be active ends on monomer chains. By saturating or flooding these ends with initiator, the polymer can essentially be capped off. Alternatively, other in situ treatments can be used to seal a polymer film if desired. The specific process (continuous monomer or pulsed monomer) can be selected to result in different types of thin films. For example, if a more uniform polymer is desired, then monomer flow can be started and stopped, the initiator is then flowed and stopped, and then the polymer is allowed to swell or complete linkages before restarting this cycle. Other applications may specify creating a less uniform polymer because of corresponding physical properties of the resultant polymer. For less uniform polymers, the initiator can be flowed continuously with the monomer thereby allowing less time for monomers to react and form larger chains. Other parameters that affect film growth are the duty cycle for introducing the initiator, the pulse width, the temperature of the substrate, and the temperature of the filament.

Figure 2:
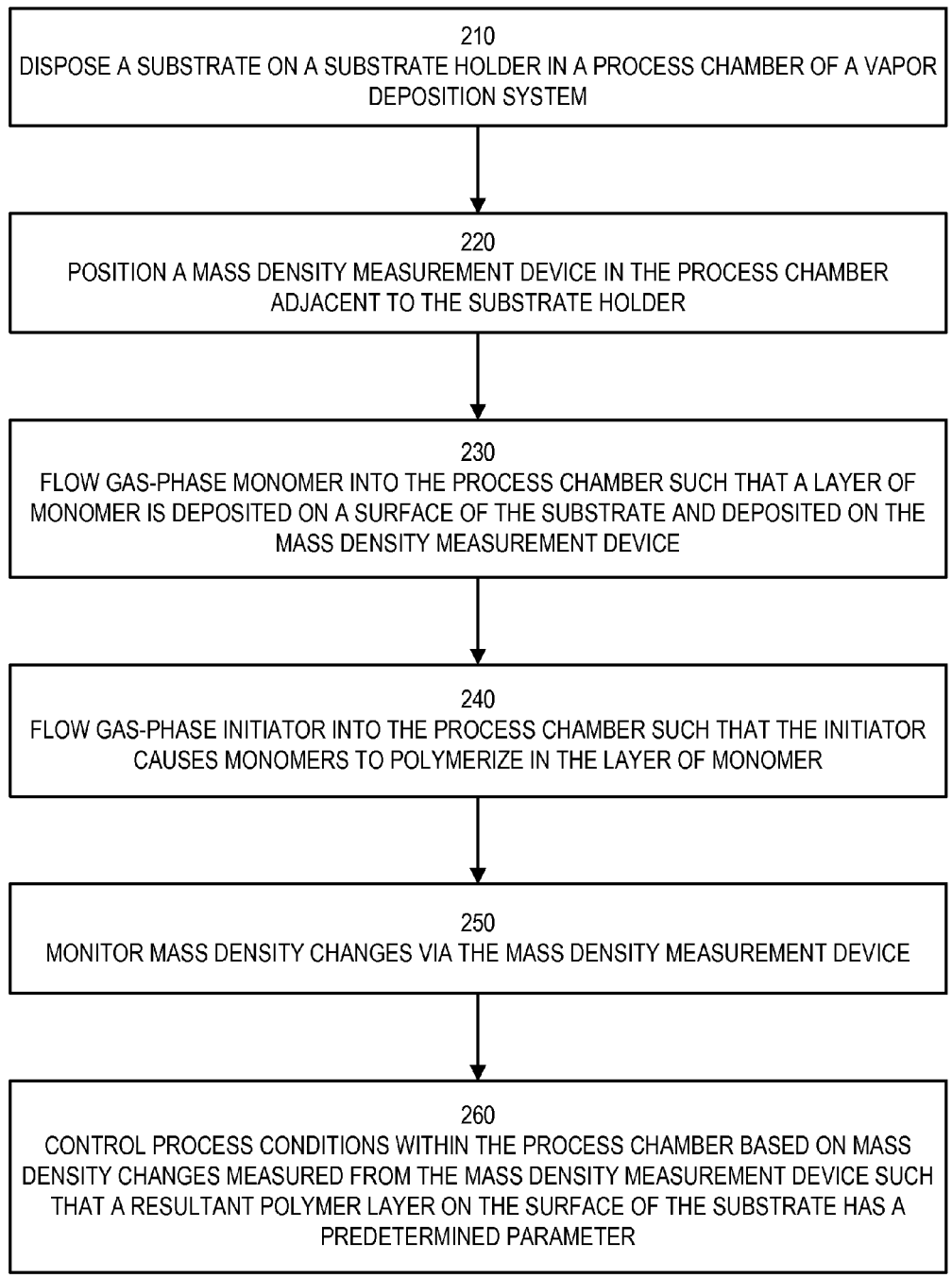
FIG. 2 is a flow chart showing an example process flow according to techniques disclosed herein.

FIG. 2 is a flow chart of an example process using a QCM or other sensor for real time tuning and detection of PDI while monomers and initiators are being flowed and deposited to form a polymer film. In step 210, a substrate is disposed on a substrate holder in a process chamber of a vapor deposition system. The substrate can be a semiconductor wafer, a flat panel, etc. The vapor deposition system can be selected from various types of vapor deposition system such as filament assisted CVD, plasma assisted CVD, atomic layer CVD, and so forth.

In step 220, a mass density measurement device is positioned in the process chamber adjacent to the substrate holder. This can include a sensor of the mass density measurement device. A portion of the mass density measurement device can be located outside of the process chamber. This can includes positioning a quartz crystal microbalance (QCM) sensor in the process chamber adjacent to the substrate holder. Adjacent can include being mounted above, to the side of, or in the same plane as the substrate holder.

In step 230, the CVD system flows a gas-phase monomer into the process chamber such that a layer of monomer is deposited on a surface of the substrate and deposited on the mass density measurement device. For such deposition, depending on the characteristics of a particular monomer, the temperature of the substrate and QCM can be set to adsorb a predetermined amount of monomer. Note that gas-phase monomer refers to a monomer of a first type and an amount of monomer instead of a single molecule.

In step 240, the CVD system flows gas-phase initiator into the process chamber such that the initiator causes monomers to polymerize in the layer of monomer. The CVD system can control amount, rate, and temperature of the initiator. Optionally, the CVD system can heat the gas-phase initiator via a heating mechanism such that molecules of the gas-phase initiator breakdown into components. Such initiator breakdown can include cracking molecular oxygen for particular operations.

In step 250, the CVD system monitors mass density changes via the mass density measurement device. In one embodiment, monitoring mass density changes includes monitoring resonant frequency changes of the QCM sensor.

In step 260, the CVD system controls process conditions within the process chamber based on mass density changes measured from the mass density measurement device such that a resultant polymer layer on the surface of the substrate has a predetermined parameter. The predetermined parameter of the resultant polymer layer can include one or more metrics such as a predetermined average polymer chain length distribution value, a predetermined thickness, a predetermined physical yield strength value, decomposition time, thermal stability, and so forth.

Controlling process conditions can include controlling flow of the gas-phase monomer and flow of the gas-phase initiator based on mass density changes measured from the mass density measurement device. This can also include controlling temperature within the process chamber, for example, to maintain the substrate and the mass density measurement device at a predetermined temperature that results in a predetermined thickness of monomer being adsorbed on the surface of the substrate. To control the growth of a film a reaction rate of polymerization needs to be known. A database of reaction rates for polymerization of various chemical can be accessed for use by the CVD system. With such information, the polymer dispersion index or rate of polymerization can be determined in real time and used to generate a polymer layer of a specific thickness and specific PDI. With a large database collected, a specific type and thickness of polymer can simply be selected, and then a library is referenced and the polymerization process works in conjunction with QCM data to create that specific polymer, such as by taking control of a tool to generate a specified polymer. For example, a yield strength of a particular property can be related to a corresponding PDI. In some reactions the result can be multiple thin polymer layers, such as by waiting for complete polymerization prior to flowing more monomer. Alternatively, a second pulse of monomer can be flowed prior to completing polymerization of an initial layer, so as to continue linking between monomer layers.

In other embodiments, flowing gas-phase monomer can include flowing gas-phase monomer for a first time duration, while flowing gas-phase initiator can include flowing the gas-phase initiator for a second time duration. This first time duration and the second time duration can be selected based on the predetermined parameter of the resultant polymer layer and based on mass density changes measured from the mass density measurement device. In some embodiments the first time duration completes prior to initiating the second time duration, while in other embodiments, the first and second time duration either overlap or occur simultaneously.

In some embodiments the CVD system ceases from flowing the gas-phase monomer and the gas-phase initiator for a third time duration, and then restarts gas-phase monomer flow after completion of the third time duration. This process can cycle multiple times. Alternatively, gas-phase initiator is flowed by pulsing gas-phase initiator at specific time intervals while gas-phase monomer flows continuously. In another embodiment, the CVD initiates flow of gas-phase initiator in response to ceasing flow of gas-phase monomer. The CVD system then ceases flow of gas-phase initiator in response to identifying a first mass density change indicating a first degree of polymerization. The CVD system then restarts flow of gas-phase monomer in response to identifying a second mass density change indicative of a first layer of monomer completing polymerization. Process control can include initiating flow of gas-phase initiator in response to ceasing flow of gas-phase monomer, and the restarting flow of gas-phase monomer in response to identifying a first mass density change indicative of a first layer of monomer being partially polymerized.

Another embodiment includes flowing a first gas-phase monomer into the process chamber as well as flowing a second gas-phase monomer into the process chamber, and also flowing a gas-phase initiator into the process chamber such that the initiator causes monomers to polymerize and form a layer on a surface of the substrate and on the mass density measurement device Another embodiment includes a vapor deposition system for use in forming polymer films. The vapor deposition system includes several components. A process chamber and a substrate holder positioned within the process chamber. The substrate holder is configured to hold a substrate. A film forming film forming composition delivery system configured to deliver at least one gas-phase monomer into the process chamber, and configured to deliver at least one gas-phase initiator into the process chamber. A gas heating device is configured to provide sufficient heat to crack the at least one gas-phase initiator. A vacuum pumping system is configured to pump gas from the process chamber. A temperature control system is configured to control temperature of the process chamber and the substrate holder. A mass density measurement device is positioned within the process chamber adjacent to the substrate holder. The mass density measurement device is configured to measure, in real time, changes in mass density of material deposited on the mass density measurement device. A system controller is configured to receive input from the mass density measurement device and control process conditions within the process chamber based on real time mass density changes measured by the mass density measurement device.

Thus, instead of requiring post polymerization analysis to identify PDI indexes, techniques herein provide real time feedback and control, providing an understanding of what is being deposited. Such in-situ monitoring of the polymerization can be advantageous for monitoring and tuning of the deposited film. With increased control and insight into the polymer film growth one is able to tune film properties for improved performance and efficiency of polymerization processes.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of forming a polymer film, the method comprising:
    disposing a substrate on a substrate holder in a process chamber of a vapor deposition system;
    positioning a mass density measurement device in the process chamber adjacent to the substrate holder, wherein positioning the mass density measurement device in the process chamber includes positioning a quartz crystal microbalance (QCM) sensor in the process chamber adjacent to the substrate holder;
    flowing a gas-phase monomer, of a first monomer, into the process chamber such that a layer of monomer is deposited on a surface of the substrate and deposited on the mass density measurement device;
    flowing a gas-phase initiator into the process chamber such that the gas-phase initiator causes monomers to polymerize in the layer of monomer;
    monitoring mass density changes via the mass density measurement device; and
    controlling process conditions within the process chamber based on mass density changes measured from the mass density measurement device such that a resultant polymer layer on the surface of the substrate has a predetermined parameter, wherein the predetermined parameter of the resultant polymer layer includes a predetermined average polymer chain length distribution value.

2. The method of claim 1, wherein monitoring mass density changes via the mass density measurement device includes monitoring resonant frequency changes of the QCM sensor.

3. The method of claim 1, wherein controlling process conditions includes controlling flow of the gas-phase monomer and flow of the gas-phase initiator based on mass density changes measured from the mass density measurement device.

4. The method of claim 1, wherein flowing the gas-phase monomer includes flowing the gas-phase monomer for a first time duration; wherein flowing the gas-phase initiator includes flowing the gas-phase initiator for a second time duration; and wherein the first time duration and the second time duration are selected based on the predetermined parameter of the resultant polymer layer and based on mass density changes measured from the mass density measurement device.

5. The method of claim 4, wherein the first time duration completes prior to initiating the second time duration.

6. The method of claim 5, further comprising:
    ceasing from flowing the gas-phase monomer and the gas-phase initiator for a third time duration; and
    restarting the gas-phase monomer flow after completion of the third time duration.

7. The method of claim 4, wherein the first time duration overlaps with the second time duration.

8. The method of claim 4, wherein the first time duration occurs simultaneously with the second time duration.

9. The method of claim 1, wherein flowing the gas-phase initiator includes pulsing flow of the gas-phase initiator at specific time intervals while the gas-phase monomer flows continuously.

10. The method of claim 1, wherein controlling process conditions comprises: initiating flow of the gas-phase initiator in response to ceasing flow of the gas-phase monomer; ceasing flow of the gas-phase initiator in response to identifying a first mass density change indicating a first degree of polymerization; and restarting flow of the gas-phase monomer in response to identifying a second mass density change indicative of the layer of monomer completing polymerization.

11. The method of claim 1, wherein controlling process conditions comprises: initiating flow of the gas-phase initiator in response to ceasing flow of the gas-phase monomer; and restarting flow of the gas-phase monomer in response to identifying a first mass density change indicative of the layer of monomer being partially polymerized.

12. The method of claim 1, further comprising: heating the gas-phase initiator via a heating mechanism such that molecules of the gas-phase initiator breakdown into components.

13. The method of claim 12, wherein breaking down the gas-phase initiator into components includes cracking molecular oxygen.

14. The method of claim 1, wherein controlling process conditions includes controlling temperature within the process chamber.

15. The method of claim 14, wherein controlling temperature includes maintaining the substrate and the mass density measurement device at a predetermined temperature that results in a predetermined thickness of monomer being adsorbed on the surface of the substrate.

16. The method of claim 1, wherein controlling process conditions within the process chamber based on mass density changes measured from the mass density measurement device includes controlling process conditions based on an identified rate of polymerization while forming the polymer film.

17. The method of claim 1, wherein controlling process conditions within the process chamber based on mass density changes measured from the mass density measurement device includes controlling process conditions based on identifying a polymer dispersion index (PDI) as the resultant polymer layer is being formed on the surface of the substrate.

18. A method of forming a polymer film, the method comprising:
    disposing a substrate on a substrate holder in a process chamber of a vapor deposition system;
    positioning a mass density measurement device in the process chamber adjacent to the substrate holder, wherein positioning the mass density measurement device in the process chamber includes positioning a quartz crystal microbalance (QCM) sensor in the process chamber adjacent to the substrate holder;
    flowing a first gas-phase monomer into the process chamber flowing a second gas-phase monomer into the process chamber flowing a gas-phase initiator into the process chamber such that the initiator causes monomers to polymerize and form a layer on a surface of the substrate and on the mass density measurement device;

monitoring mass density changes via the mass density measurement device; and controlling process conditions within the process chamber based on mass density changes measured from the mass density measurement device such that a resultant polymer layer on the surface of the substrate has a predetermined polymer chain length distribution value.

* * * * *